United States Patent
Lee et al.

(10) Patent No.: US 6,836,225 B2
(45) Date of Patent: Dec. 28, 2004

(54) FAST SEARCH METHOD FOR NEAREST NEIGHBOR VECTOR QUANTIZATION

(75) Inventors: Nam-Il Lee, Suwon-si (KR); Yong-Serk Kim, Suwon-si (KR); Seong-Kyu Hwang, Seoul (KR); Sang-Won Kang, Anyang-si (KR); Sang-Hyun Chi, Gangwon-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/670,743

(22) Filed: Sep. 26, 2003

(65) Prior Publication Data

US 2004/0108944 A1 Jun. 10, 2004

(30) Foreign Application Priority Data

Sep. 27, 2002 (KR) .............................. 10-2002-0058752

(51) Int. Cl.[7] .............................................. H03M 7/00
(52) U.S. Cl. .............................. 341/50; 704/222; 707/1
(58) Field of Search ..................... 341/50, 51; 704/222, 704/230; 707/1, 2, 3; 375/242, 243

(56) References Cited

U.S. PATENT DOCUMENTS

| 5,255,090 | A | * | 10/1993 | Israelsen ................ 375/240.12 |
| 5,677,986 | A | * | 10/1997 | Amada et al. ............... 704/222 |
| 5,734,791 | A | * | 3/1998 | Acero et al. ................. 704/222 |
| 5,920,853 | A | * | 7/1999 | Benyassine et al. ........... 707/1 |
| 6,192,336 | B1 | * | 2/2001 | Manduchi et al. .......... 704/230 |

* cited by examiner

Primary Examiner—Brian Young
Assistant Examiner—John Nguyen
(74) Attorney, Agent, or Firm—Roylance, Abrams, Berdo & Goodman, L.L.P.

(57) ABSTRACT

A fast search method for searching for an optimum codeword for nearest neighbor vector quantization. An upper boundary value and a lower boundary value between which an optimum codeword will exist in a codebook are calculated using a distortion of a designated element in an input vector and an experimentally determined threshold. Further, a start point and an end point for codebook search are determined using a binary search method from a codebook rearranged in descending order, and a full search scheme is applied only within a search range calculated by the determined start point and end point, thereby determining an optimum codeword for nearest neighbor vector quantization.

10 Claims, 7 Drawing Sheets

| | 1 | 2 | 3 | ... | j | | k-1 | k |
|---|---|---|---|---|---|---|---|---|
| $y_1$ | | | | | 420 | | | |
| $y_2$ | | | | | 270 | | | |
| $y_3$ | | | | | 353 | | | |
| $y_4$ | | | | | 310 | | | |
| $y_5$ | | | | | 149 | | | |
| $y_6$ | | | | | 80 | | | |
| $y_7$ | | | | | 172 | | | |
| $y_8$ | | | | | -30 | | | |
| $y_9$ | | | | | 68 | | | |
| $y_{10}$ | | | | | -90 | | | |
| $y_{11}$ | | | | | -47 | | | |
| $y_{12}$ | | | | | 5 | | | |
| $y_{13}$ | | | | | 43 | | | |
| $y_{14}$ | | | | | -73 | | | |
| $y_{15}$ | | | | | -9 | | | |

FAST SEARCH METHOD FOR NEAREST NEIGHBOR VECTOR QUANTIZATION

PRIORITY

This application claims priority under 35 U.S.C. § 119 to an application entitled "Fast Search Method for Nearest Neighbor Vector Quantization" filed in the Korean Intellectual Property Office on Sep. 27, 2002 and assigned Ser. No. 2002-58752, the contents of which are incorporated herein by reference.

BACKGROUND OF THE INVENTION

1. Field of the Invention

The present invention relates generally to a vector quantization method, and in particular, to a method of rapidly searching for an optimum codeword for nearest neighbor vector quantization.

2. Description of the Related Art

Nearest neighbor vector quantization (NNVQ) is a quantization method that is most popularly used in a data compression and recognition field. At a given bit rate, such nearest neighbor vector quantization has less quantization error than scalar quantization such as pulse code modulation (PCM), differential pulse code modulation (DPCM) and adaptive differential pulse code modulation (ADPCM). That is, nearest neighbor vector quantization is popularly applied to the fields of speech coding, audio coding, image coding, and speech recognition.

To perform nearest neighbor vector quantization, an operation of searching for an optimum codeword in searching a codebook comprised of a plurality of codewords and quantizing an input vector through the search is required. The optimum codeword refers to a codeword where a quantization error with the input vector is minimized. Conventional methods proposed to search for an optimum codeword through the codebook search can be classified into the following three methods. A first method is a vector quantization method by full search, for performing nearest neighbor vector quantization on all codewords constituting a codebook, a second method is a vector quantization method using a partial distance search scheme, and a third method is a vector quantization method using a threshold.

First, a method for performing nearest neighbor vector quantization by full search, which corresponds to the first method, will be described herein below.

Figure 1:
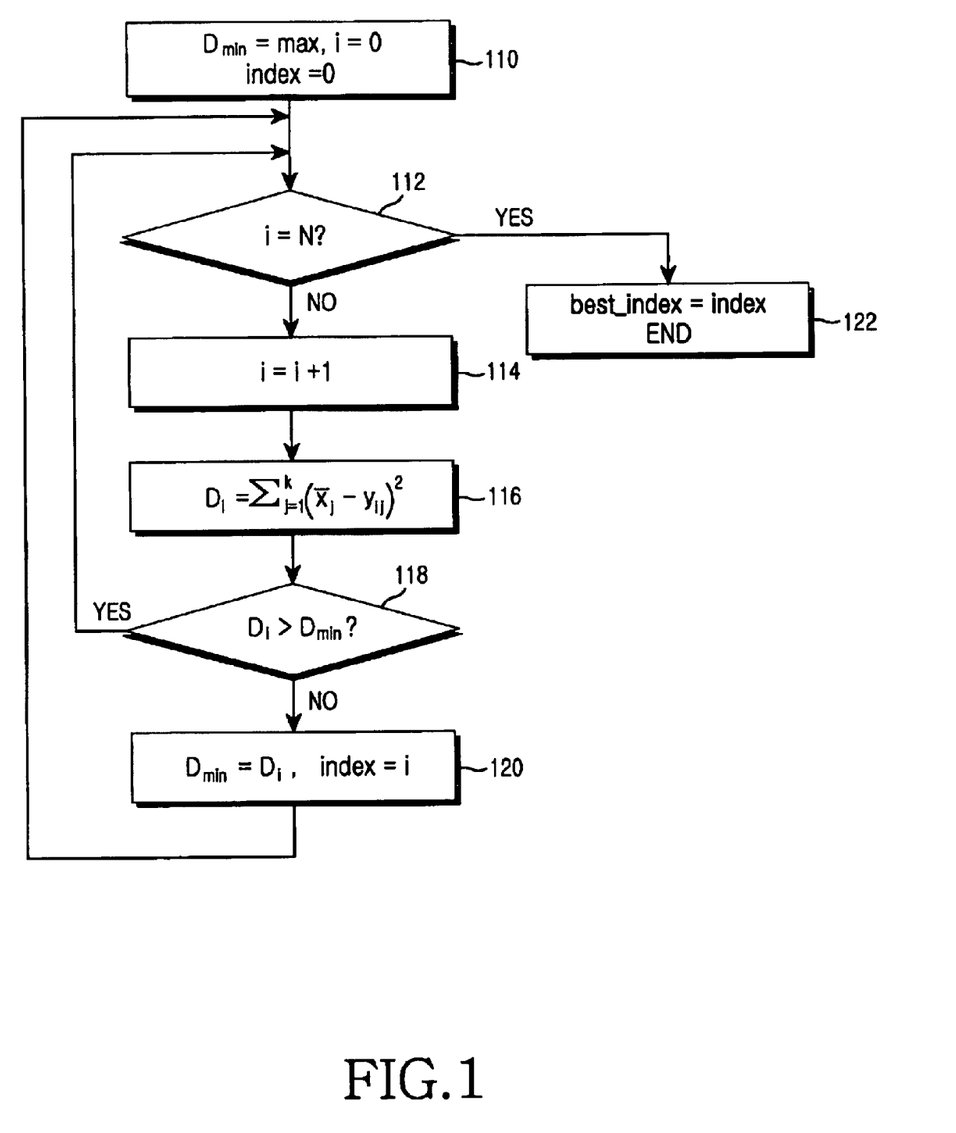
FIG. 1 is a flowchart illustrating a procedure for determining an optimum codeword for nearest neighbor vector quantization by conventional full search.

FIG. 1 is a flowchart illustrating a procedure for performing nearest neighbor vector quantization by full search. Referring to FIG. 1, parameter values '$D_{min}$', 'i' and 'index' for nearest neighbor vector quantization are initialized in step 110. That is, the '$D_{min}$' parameter is set to a maximum value 'max', and the 'i' and the 'index' parameters are set to 0. '$D_{min}$' is a parameter for setting the minimum value among quantization errors between codewords $\bar{y}_i$ constituting a codebook and an input vector $\bar{x}$, and 'i' is a parameter for selecting one codeword from the codewords $\bar{y}_i$ in order to calculate a quantization error with the input vector $\bar{x}$. If it is assumed that the total number of the codewords constituting the codebook is N, then 'i' ranges from 1 to N. The parameter 'index' means an index indicating a codeword corresponding to the minimum quantization error value $D_{min}$ with the input vector $\bar{x}$. Therefore, 'index' will become a particular value among integers between 1 and N, which is the range of 'i'.

If initialization of the parameters is completed, 'i' is compared with 'N' in step 112 to determine whether quantization error calculation for all the codewords is completed. If it is determined that quantization error calculation for all the codewords is not completed, the procedure proceeds to step 114. The quantization error calculation is a procedure for determining an optimum codeword that minimizes a quantization error. In step 114, 'i' is increased by 1 so that a codeword with the next index can be selected. If a codeword with the next index is selected in step 114, a quantization error $D_i$ between the selected codeword and the input vector is calculated in step 116. For example, a quantization error $D_i$ between an input vector $\bar{x}$ with an order k and an $i^{th}$ codeword $y_i$ can be calculated by $$d[\bar{x}, y_i] = D_i = \frac{1}{k}(\bar{x} - y_i)(\bar{x} - y_i)^T = \frac{1}{k}\sum_{j=1}^{k}[\bar{x}_j - y_{ij}]^2 \quad (1)$$

where k means an order of the input vector $\bar{x}$, $y_i$ means an $i^{th}$ codeword, and $\bar{x}_j$ and $y_{ij}$ mean $j^{th}$ elements of the vector $\bar{x}$ and the codeword $y_i$, respectively.

If calculation of the $D_i$ corresponding to the current 'i' is completed in step 116, it is determined in step 118 whether $D_i$ is larger than $D_{min}$. If $D_i$ is larger than $D_{min}$, the procedure returns to step 112 without changing the $D_{min}$ to repeatedly perform the steps 112 to 116. However, if $D_i$ is not larger than $D_{min}$, the procedure returns to step 112 after changing the value of $D_i$ to the value of $D_{min}$ and setting the 'index' to 'i' in step 120. The reason for setting the value of $D_i$ to the value of $D_{min}$ is to constantly maintain $D_{min}$ as the minimum value, and at this moment, by setting the 'i' to the 'index', it is possible to designate a corresponding codeword.

The steps 114 to 120 are repeatedly performed until it is determined that the process of determining an optimum codeword for nearest neighbor vector quantization for all of N codewords in step 112 is completed. If the process of determining an optimum codeword for nearest neighbor vector quantization for all of N codewords is completed, $D_{min}$ has a minimum quantization error value and the parameter 'index' will designate a codeword corresponding thereto. Therefore, in step 122, a value set to 'index' is designated as 'best_index', and the input vector $\bar{x}$ is quantized by a codeword $y_{index}$ corresponding to the best_index.

In the first method stated above, a quantization error $D_i$ with an input vector is calculated for each of all codewords constituting a codebook. The first method has two fundamental problems. First, as an order k of the input vector is increased, complexity of operation needed for the codebook search is increased by geometric progression. Such a problem must be resolved first of all in order to perform nearest neighbor vector quantization on a real-time basis. Second, as an order k of the input vector is increased, a size of a memory required for storing codewords is increased by geometric progression.

For example, assuming that an order of a vector is k and a size of a codebook is N, if the full search scheme is applied, (k×N) multiplications and (2k×N–N) additions, subtractions and comparisons are required in order to quantize an input vector. In the full search scheme, a memory for storing a codebook, a size of the memory being proportional to a size of the codebook, is increased in size by geometric progression as an order k of a vector is increased.

Next, a vector quantization method using a partial distance search (PDS) scheme, which corresponds to the second method, will be described herein below. The vector quantization method using the partial distance search scheme was proposed in IEEE, vol. COM-33, pp.

1132–1133 in order to reduce the number of calculations required in the full search scheme. The entire content of this IEEE document is incorporated herein by reference. When calculating a quantization error between an input vector and each candidate codeword, the second method proposed in IEEE vol. COM-33, pp. 1132–1133 calculates the quantization error for r elements rather than all elements of a candidate vector (where r≦k). This is because while a quantization error for a particular codeword among a plurality of codewords is being calculated, if the quantization error is larger than a minimum quantization error value $D_{min}$ from a particular point r to a previous point, it is obvious that even though the quantization error for the particular codeword is calculated further, the quantization error will be larger than $D_{min}$.

Figure 2:
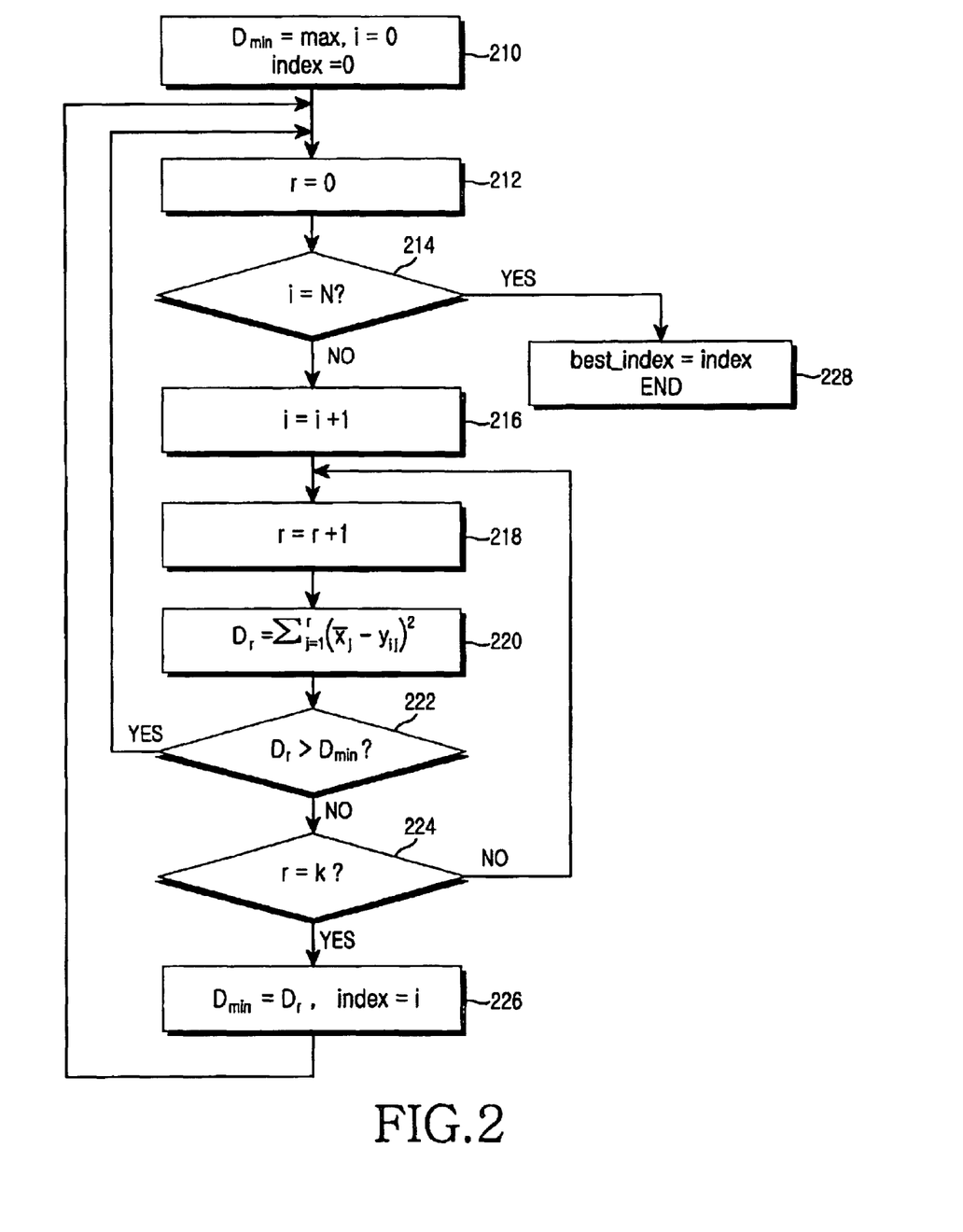
FIG. 2 is a flowchart illustrating a procedure for determining an optimum codeword for nearest neighbor vector quantization by conventional partial distance search.

FIG. 2 is a flowchart illustrating a vector quantization procedure using the partial distance search scheme. Referring to FIG. 2, parameter values '$D_{min}$', 'i' and 'index' for nearest neighbor vector quantization are initialized in step 210. That is, '$D_{min}$' is set to a maximum value 'max', and 'i' and 'index' are set to 0. If initialization of the parameters is completed, a parameter 'r' for counting the number of elements $y_i$ used during quantization error calculation for a particular codeword $y_i$ is set to 0 in step 212. The 'i' is compared with the 'N' in step 214 to determine whether quantization error calculation for all the codewords is completed. If it is determined that quantization error calculation for all the codewords is not completed, the procedure proceeds to step 216. Otherwise, the procedure proceeds to step 228. In step 216, the value of 'i' is increased by 1 so that a codeword with the next index can be selected. If a codeword with the next index is selected in step 216, the value of 'r' is increased by 1 in step 218 so that the next element among elements of a corresponding codeword can be selected. If 'i' and 'r' are determined, a quantization error $D_r$ between an input vector and an element selected by the value of r is calculated beginning at the first element of the selected codeword in step 220. For example, a quantization error $D_r$ between an input vector $\overline{x}$ with an order k within a range of r and an $i^{th}$ codeword $y_i$ can be calculated by $$D_r = \sum_{j=1}^{r} [\overline{x_j} - y_{ij}]^2 \qquad (2)$$

where $\overline{x_j}$ is a $j^{th}$ element of an input vector $\overline{x}$, and $y_{ij}$ means a $j^{th}$ element of an $i^{th}$ codeword.

If calculation of $D_r$ corresponding to an $r^{th}$ element of a particular codeword $y_i$ is completed by step 220, it is determined in step 222 whether $D_r$ is larger than $D_{min}$. $D_{min}$ can become the minimum value among quantization errors calculated by all codewords up to a previous codeword $y_{i-1}$. If $D_r$ is larger than $D_{min}$, the procedure proceeds to step 212 without changing the value of $D_{min}$. This is to stop quantization error calculation for the particular codeword $y_i$ and then perform quantization error calculation on the next codeword $y_{i+1}$. However, if $D_r$ is not larger than $D_{min}$ in step 222, it is determined in step 224 whether the value of r is identical to an order k of the particular codeword $y_i$ (r=k). That is, it is determined whether $D_r$ is a quantization error value calculated for all elements constituting the particular codeword $y_i$. If it is determined in step 224 that quantization error calculation for all elements is not completed (i.e., the value of r is not equal to the value of k), the procedure returns to step 218. Otherwise, the procedure proceeds to step 226. Returning to step 218 is to consider up to the next element including an element for which quantization error calculation has been performed up to now, among the elements constituting the particular codeword $y_i$, for quantization error calculation. Thereafter, calculation of the quantization error $D_r$ is performed through step 220. As described above, the quantization error calculation process for the particular codeword $y_i$ is repeatedly performed until the quantization error value $D_r$ calculated for all the elements constituting the particular codeword $y_i$ becomes larger than the $D_{min}$.

However, if the value of r is identical to the value of k in step 224, the value of $D_r$ is changed to the value of $D_{min}$ and the value of 'index' is set to 'i' in step 226. Thereafter, the procedure returns to step 212 to perform a quantization error calculation process on the next codeword. Setting the value of $D_r$ to the value of $D_{min}$ is to constantly maintain $D_{min}$ as the minimum value. At this moment, by setting the value of 'i' to the value of 'index', it is possible to designate a corresponding codeword. That is, the reason for setting the value of $D_r$ to the value of $D_{min}$ in step 226 is because since it was determined in step 222 that $D_r$ was not larger than $D_{min}$, it can be determined that the quantization error value calculated by all elements constituting the $y_i$ is the minimum value among the quantization error values calculated up to the present.

Meanwhile, the steps 212 to 226 are repeatedly performed until it is determined that the process of determining an optimum codeword for nearest neighbor vector quantization for all of N codewords in step 214 is completed. If the process of determining an optimum codeword for nearest neighbor vector quantization for all the codewords is completed, $D_{min}$ has a minimum quantization error value and 'index' will designate a codeword corresponding thereto. Therefore, in step 228, a value set to 'index' is designated as 'best_index', and the input vector $\overline{x}$ is quantized by a codeword $y_{index}$ corresponding to the best_index.

Compared with the first method, the second method can remarkably reduce the number of multiplications, but needs additional comparison operations undesirably.

A vector quantization method using a threshold, which corresponds to the third method, will now be described herein below. The vector quantization method using a threshold is disclosed in U.S. Pat. No. 5,619,717, issued on Apr. 8, 1997, filed by Erik Staats, the entire contents of which is incorporated herein by reference. The third method reduces the number of calculations by performing nearest neighbor vector quantization using a table in which previously calculated distances between codewords are stored. That is, codewords in a codebook are rearranged on the basis of frequency of quantization or a distance between the codewords, and thresholds associated with the rearranged codewords are separately stored, to thereby perform quantization by a codeword with a threshold corresponding to an input vector.

Figure 3:
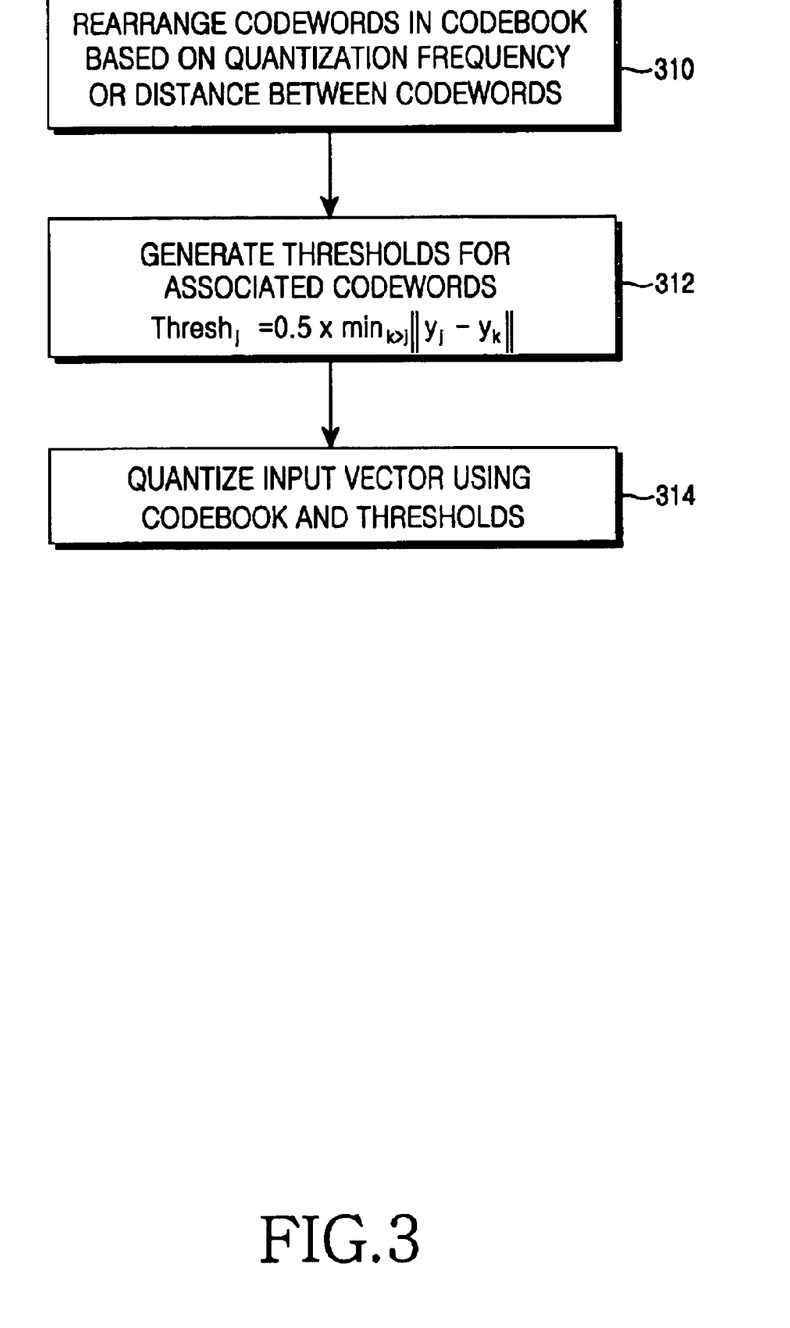
FIG. 3 is a flowchart illustrating a procedure for determining an optimum codeword for nearest neighbor vector quantization by a threshold corresponding to each of codewords.

FIG. 3 is a flowchart illustrating a procedure for performing nearest neighbor vector quantization using a previously calculated distance between codewords. Referring to FIG. 3, codewords in a codebook are rearranged on the basis of quantization frequency or a distance between the codewords in step 310. Thereafter, in step 312, thresholds associated with the rearranged codewords are generated in step 312. For example, if a size of the codebook is N, thresholds associated with other codewords except an $N^{th}$ codeword are generated. The threshold can be defined as ½ of a distance between a corresponding codeword and its nearest codeword. Equation (3) represents a threshold $Thresh_j$ for a $j^{th}$ codeword $y_j$.

$$Thresh_j = 0.5 \times \min_{k>j} \|y_j - y_k\| \qquad (3)$$

Thresholds calculated in this manner are stored in association with their corresponding codewords. Therefore, for the third method proposed, a separate memory area for storing the thresholds is needed. If generation of the thresholds is completed, an input vector $\overline{x}$ is quantized using the rearranged codebook and the stored thresholds in step 314. If a distance between an input vector $\overline{x}$ and a codeword $y_j$ is smaller than a threshold $Thresh_j$ corresponding to the codeword $y_j$, a process of searching for the nearest codeword is ended. Then, the input vector $\overline{x}$ is quantized by a codeword $y_j$.

The third method must additionally secure a memory space for storing previously calculated distances between codewords, in addition to a memory space for storing the codewords. Thus, compared with the other conventional vector quantization methods, the third method is undesirable since it requires more memory space.

SUMMARY OF THE INVENTION

It is, therefore, an object of the present invention to provide a vector quantization method capable of reducing a search range of codewords constituting a codebook which is an object of full search.

It is another object of the present invention to provide a vector quantization method for searching a codebook with a small number of calculations without performance deterioration.

It is further another object of the present invention to provide a method for searching a codebook with a small number of calculations without an additional increase in memory space.

To achieve the above and other objects, there is provided a method for searching a codebook having a plurality of codewords for an optimum codeword for quantizing an input vector. The method comprises the steps of: calculating a lower boundary value and an upper boundary value by subtracting and adding a predetermined threshold from/to an element value corresponding to a particular position among a plurality of elements constituting the input vector; designating, as search object codewords, codewords having element values existing between the lower boundary value and the upper boundary value among element values corresponding to the particular position in the respective codewords constituting the codebook; and determining optimum codewords having a minimum quantization error value through full search for calculating a quantization error value with the input vector for the search object codewords.

Preferably, the step of designating search object codewords comprises the steps of: rearranging the codewords in the codebook in descending order by a size of element values corresponding to the particular position in the respective codewords constituting the codebook; determining a point first corresponding to an element value smaller than the upper boundary value as a start point by comparing the upper boundary value with element values corresponding to the particular position in the rearranged codewords; determining a point first corresponding to an element value larger than an element value that is smaller than the lower boundary value as an end point by comparing the lower boundary value with element values corresponding to the particular position in the rearranged codewords; and designating codewords existing between the start point and the end point as the search codewords.

Preferably, the step of designating search object codewords comprises the steps of: rearranging the codewords in the codebook in ascending order by a size of element values corresponding to the particular position in the respective codewords constituting the codebook; determining a point first corresponding to an element value larger than the lower boundary value as a start point by comparing the lower boundary value with element values corresponding to the particular position in the rearranged codewords; determining a point first corresponding to an element value smaller than an element value that is larger than the lower boundary value by comparing the upper boundary value with element values corresponding to the particular position in the rearranged codewords; and designating codewords existing between the start point and the end point as the search codewords.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will now be described in detail with reference to the annexed drawings. In the following description, a detailed description of known functions and configurations incorporated herein has been omitted for conciseness.

In this embodiment of the invention, upper and lower boundaries between which an optimum codeword will exist in a codebook are calculated using a distortion of a designated element in an input vector and an experimentally determined threshold. In addition, a start point and an end point for codebook search are determined using a binary search scheme from a codebook rearranged in descending order according to a size of a particular element of a codeword, and an optimum codeword for nearest neighbor vector quantization is determined by a full search scheme only within a search range determined by the start point and the end point. Here, a threshold is determined using the maximum value among optimum mean squared error (MSE) values for training vectors having a sufficient length, and a range where an optimum codeword for an input vector exists is determined using the property that a distance between an input vector and a single element value designated as an optimum codeword is smaller than the threshold. Also, an element used in determining the search range is selected so as to experimentally previously determine an element for maximizing a decreasing rate of the search range among vector elements.

That is, in order to realize an embodiment of the present invention, the maximum value among optimum MSE values for training vectors are determined as an optimum codeword for an input vector, and a threshold is determined using the determined maximum value and an optimum control element determined by experiment. In addition, an element (hereinafter referred to as a "$j^{th}$ element") for maximizing a decreasing rate of a search range among vector elements is experimentally previously determined, and a codebook is rearranged according to a size of this element. If the threshold is determined, a lower boundary value is determined by subtracting the determined threshold from the $j^{th}$ element among a plurality of elements constituting an input vector, and an upper boundary value is determined by adding the determined threshold to the $j^{th}$ element among a plurality of elements constituting the input vector. Thereafter, codewords having element values existing between the lower boundary value and the upper boundary value are designated as codewords serving as objects of full search (hereinafter referred to as "search object codewords") by comparing the $j^{th}$ elements' values in the respective codewords constituting the codebook with the lower boundary value and the upper boundary value. If the search object codewords are designated, quantization error values are calculated by applying a full search scheme to each of the search object codewords. A minimum quantization error value is selected from the calculated quantization error values, and the selected minimum quantization error value is determined as an optimum codeword. Herein, 'j' means order of an element for maximizing a decreasing rate of a search range among $1^{st}$ to $k^{th}$ vector elements, and is an experimentally previously determined value.

Figure 4:
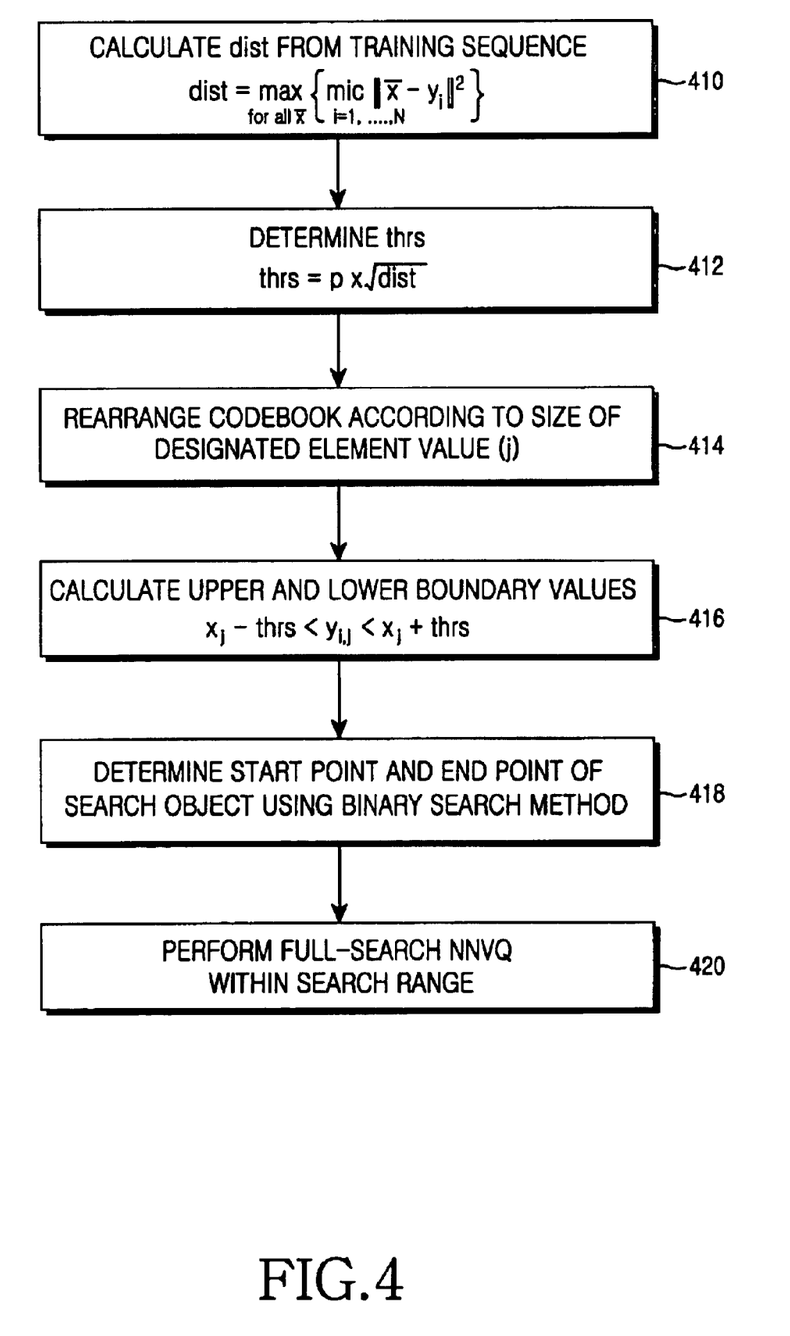
FIG. 4 is a flowchart illustrating a procedure for searching for an optimum codeword for nearest neighbor vector quantization according to an embodiment of the present invention.
Figure 5:
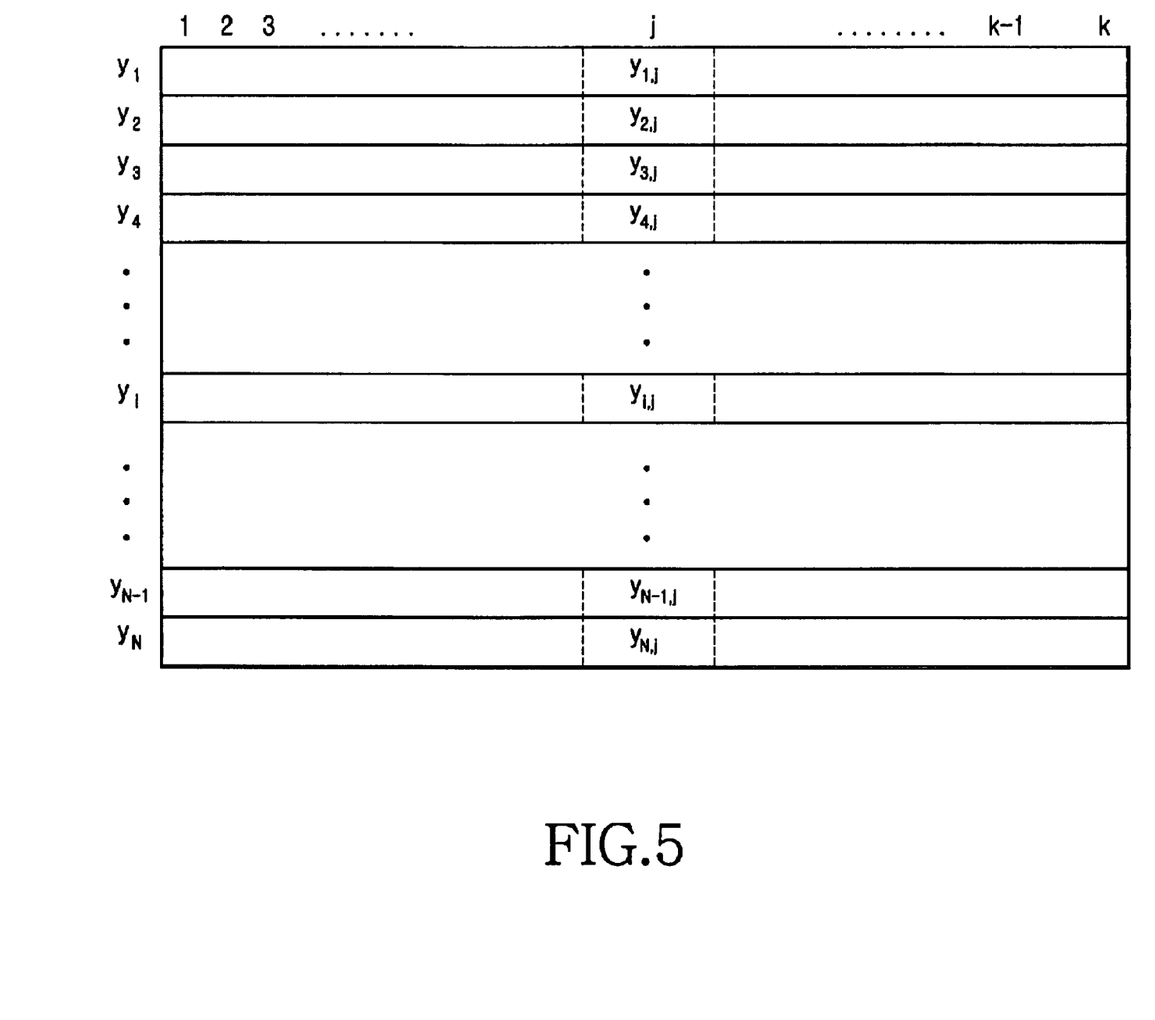
FIG. 5 is a diagram illustrating a structure of a codebook according to an embodiment of the present invention.

FIG. 4 is a flowchart illustrating a procedure for determining a codeword for nearest neighbor vector quantization according to an embodiment of the present invention. FIG. 5 is a diagram illustrating a structure of a codebook to which the present invention is applied.

The codeword determination procedure of FIG. 4 includes a first process of calculating an upper boundary value and a lower boundary value in codewords constituting a codebook, a second process of rearranging the codewords in the codebook, a third process of determining a start point and an end point of a search range for the codewords in the codebook, and a fourth process of performing full search on the codewords within the determined search range.

Referring to FIG. 4, a distortion value for calculating an upper boundary value and a lower boundary value is calculated from training vectors in step 410. The training vectors are defined as a sufficiently large number of vectors having the same characteristic as an input vector of a quantizer, and the distortion value can be determined as the maximum value among optimum MSE values for the training vectors.

The distortion value can be calculated by $$dist = \max_{for\ all} \bar{x} \left\{ \min_{i=1,\ldots,N} \|\bar{x} - y_i\|^2 \right\} \quad (4)$$

where N denotes a size of a codebook, $\bar{x}$ denotes an input vector, and $y_i$ denotes an $i^{th}$ codeword.

If calculation of distortion values is completed in step 410, a threshold 'thrs' is calculated in step 412. The threshold thrs is calculated using the distortion value experimentally determined from the training sequence and a control element P in accordance with Equation (5) below.

$$thrs = P \times \sqrt{dist} \quad (5)$$

where P is a control element for controlling a size of a search range and MSE performance.

The P has a value between 0 and 1, and if the P has a larger value, the search range is increased. "The P has a large value" means that the P approximates 1. Meanwhile, the P is experimentally determined so as to minimize a search range while showing the same performance as the general full search.

Values of elements $y_{1,j}$, $y_{2,j}$, $y_{3,j}$, $y_{4,j}$, ..., $y_{N-1,j}$, $y_{N,j}$ existing in a particular position j of respective codewords $y_1$, $y_2$, $y_3$, $y_4$, ..., $y_{N-1}$, $y_N$ in a N×k codebook are compared in step 414. Further, the codewords $y_1$, $y_2$, $y_3$, $y_4$, ..., $y_{N-1}$, $y_N$ in the codebook are determined according to sizes of values of the elements $y_{1,j}$, $y_{2,j}$, $y_{3,j}$, $y_{4,j}$, ..., $y_{N-1,j}$, $y_{N,j}$. That is, the codewords $y_1$, $y_2$, $y_3$, $y_4$, ..., $y_{N-1}$, $y_N$ are rearranged in order of size irrespective of ascending order or descending order.

If arrangement of the codebook is completed, upper and lower boundary values are calculated by the threshold thrs determined from Equation (5) in step 416. For example, upper and lower boundary values of an area where an optimum codeword will exist are calculated using the threshold thrs determined by experiment in step 412. Therefore, for a codebook comprised of N codewords $y_1$, $y_2$, $y_3$, $y_4$, ..., $y_{N-1}$, $y_N$ each having k elements as illustrated in FIG. 5, the upper boundary value and the lower boundary value can be defined as $$|\bar{x}_j - y_{ij}| < thrs, \ (0 \leq i \leq N, \ 0 \leq j \leq k) \quad (6)$$

Equation (6) can be converted into $$\bar{x}_j - thrs < y_{ij} < \bar{x}_j + thrs, \ (0 \leq i \leq N, \ 0 \leq j \leq k) \quad (7)$$

where $\bar{x}_j$ means a $j^{th}$ element of an input vector $\bar{x}$, $y_{ij}$ means $j^{th}$ elements $y_{1,j}$, $y_{2,j}$, $y_{3,j}$, $y_{4,j}$, ..., $y_{N-1,j}$, $y_{N,j}$ of $i^{th}$ codewords, '$\bar{x}_j$−thrs' means a lower boundary value, and '$\bar{x}_j$+thrs' means an upper boundary value.

In step 418, a start point and an end point of a search object are determined using a binary search method. The start point and the end point can be calculated by the upper boundary value and the lower power boundary value, both calculated in step 416. For example, when the codebook is rearranged in ascending order, the start point is determined by applying the binary search method to the lower boundary value and the end point is determined by applying the binary search method to the upper boundary value. In contrast, when the codebook is rearranged in descending order, the start point is determined by applying the binary search method to the upper boundary value and the end point is determined by applying the binary search method to the lower boundary value. For example, if it is assumed that the codebook is rearranged in descending order, a start point is determined by the upper boundary value and an end point is determined by the lower boundary value in the following manner. First, $j^{th}$ elements' values of the rearranged codewords are compared with the upper boundary value, and an element value at a point where it becomes smaller than the upper boundary value, among the $j^{th}$ elements' values, are determined as a start point. Further, $j^{th}$ elements' values of the rearranged codewords are compared with the lower boundary value, and an element value at a point when it becomes smaller than the lower boundary value, among the $j^{th}$ elements' values, are determined as an end point. As a result, a range between the start point and the end point is determined as a search range.

If a search range is determined by the start point and the end point, full search is performed on codewords existing in the search range in step 420. If an optimum codeword having a minimum quantization error value among the codewords existing in the search range is determined by the full search, an index corresponding to the optimum codeword is designated as a best index. Thereafter, the input vector $\bar{x}$ is quantized as a codeword corresponding to the best index.

In the embodiment of the present invention, an average distance between the start point and the end point, i.e., an average size N' of a search object codebook, is smaller than the size N of the entire codebook. Therefore, it is possible to resolve the complexity problem by reducing a size of the search codebook related to encoding complexity in the full search.

Figure 6A:
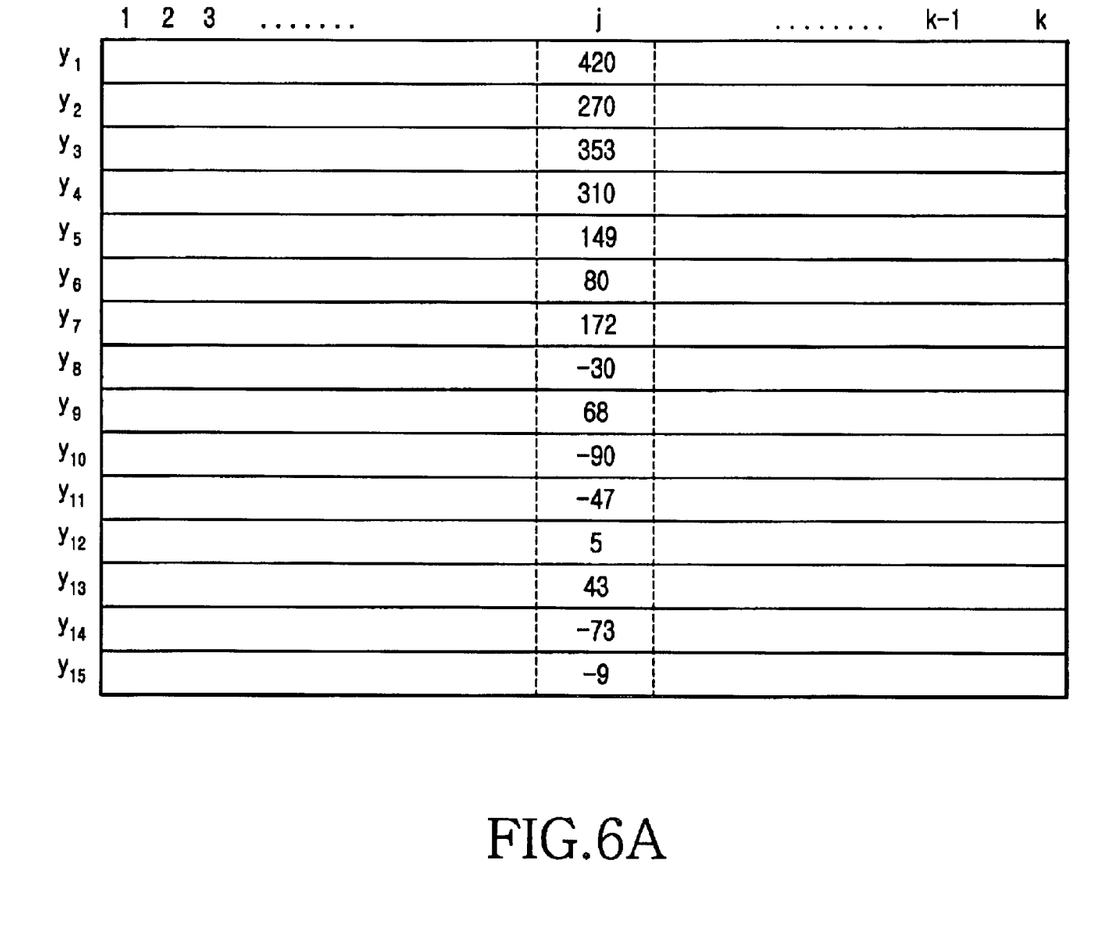
FIG. 6A is a diagram illustrating an example of a codebook according to an embodiment of the present invention.
Figure 6B:
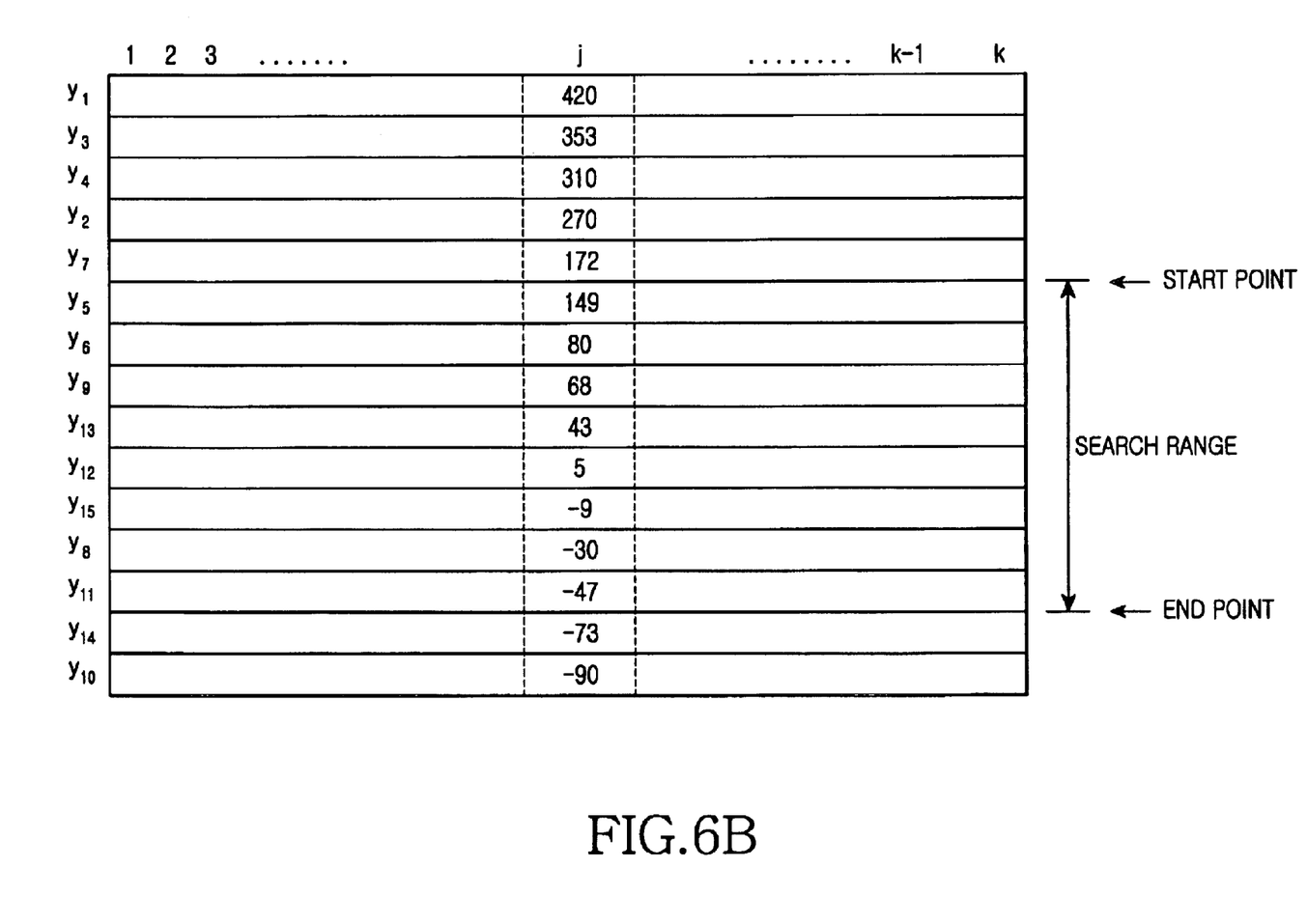
FIG. 6B is a diagram illustrating an example of a rearranged codebook.

FIG. 6A is a diagram illustrating an example of a codebook according to an embodiment of the present invention, and FIG. 6B is a diagram illustrating an example of a rearranged codebook.

An operation of the invention will now be described herein below with reference to FIGS. 6A and 6B. Codewords $y_1, y_2, y_3, y_4, \ldots, y_{14}, y_{15}$ shown in FIG. 6A are rearranged in descending order by $j^{th}$ elements' values of the codewords $y_1, y_2, y_3, y_4, \ldots, y_{14}, y_{15}$. If the codewords $y_1, y_2, y_3, y_4, \ldots, y_{14}, y_{15}$ are rearranged in descending order, a codebook rearranged in order of $y_1, y_3, y_4, y_2, y_7, y_5, y_6, y_9, y_{13}, y_{12}, y_{15}, y_8, y_{11}, y_{14}, y_{10}$ shown in FIG. 6B is generated. As illustrated in FIG. 6B, the generated codebook is rearranged in descending order, i.e., in order of size of $j^{th}$ elements' values.

It will be assumed herein that a $j^{th}$ element value of an input vector $\bar{x}$ is 50, and a threshold thrs calculated using a distortion value dist determined by experiment and a control factor P is 100. If the $j^{th}$ element value of an input vector $\bar{x}$ and the threshold thrs are applied to Equation (7), an upper boundary value is determined as 150 and a lower boundary value is determined as −50.

If rearrangement of the codebook is completed, the $j^{th}$ elements' values are sequentially compared with the upper boundary value 150 to search for a $j^{th}$ element value smaller than the upper boundary value 150. It can be understood from FIG. 6B that the first $j^{th}$ element value smaller than the upper boundary value 150 is 149. Therefore, a point having 149 as a $j^{th}$ element value is determined as a start point. Next, the $j^{th}$ elements' values are sequentially compared with the lower boundary value −50 to search for a $j^{th}$ element value smaller than the lower boundary value −50. In FIG. 6B, as the first $j^{th}$ element value smaller than the lower boundary value −50 is −73, a point where among $j^{th}$ elements' values arranged in descending order, −47 which is larger than −73 is used as a $j^{th}$ element value is determined as an end point. Therefore, the final search range is determined as a range between $y_5$ having 149 as its $j^{th}$ element value and $y_{11}$ having −47 as its $j^{th}$ element value among the rearranged codewords. That is, $y_5, y_6, y_9, y_{13}, y_{12}, y_{15}, y_8, y_{11}$ are determined as search object codewords. Thereafter, full search for searching for an optimum codeword is performed on the input vector $\bar{x}$ and the respective search object codewords.

As can be understood from the foregoing description, the invention proposes a fast search algorithm that has no SNR (Signal-to-Noise Ratio) performance deterioration and requires no additional memory space, for an NNVQ algorithm popularly used in a voice and image signal processing field. For example, when vector quantization was performed on a Gauss-Markov source having a correlation coefficient of $\rho=0.86$, using a codebook having a length of 64 and an order of 3, an average search range of the codebook was reduced by about 52%. As another example, in the case of AMR (Adaptive Multi-Rate) voice coder, a standard for a 3GPP ($3^{rd}$ Generation Partnership Project) asynchronous narrowband voice coder, when LSF (Line Spectral Frequency) codebook was quantized in a 12.2 Kbps mode, addition/subtraction operations showed operation reduction effect of 51.4% on average, multiplication operation showed operation reduction effect of 51.5% on average, and comparison operation showed operation reduction effect of 58.1% on average, without SNR performance degradation. In addition, an average size of the search codebook could be reduced by about 60%.

As described above, embodiment of the invention applies full search only to codewords within a search range where there is high probability that an optimum codeword for an input vector among codewords in a codebook will exist, thereby reducing a search time for nearest neighbor vector quantization with the minimized memory capacity. In addition, the embodiment of the invention can simplify a processing procedure by reducing the number of operations required in performing nearest neighbor vector quantization on an input vector.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for searching a codebook having a plurality of codewords for an optimum codeword for quantizing an input vector, comprising the steps of:

calculating a lower boundary value and an upper boundary value by subtracting and adding a predetermined threshold from/to an element value corresponding to a particular position among a plurality of elements constituting the input vector;

designating, as search object codewords, codewords having element values existing between the lower boundary value and the upper boundary value among element values corresponding to the particular position in the respective codewords constituting the codebook; and determining optimum codewords having a minimum quantization error value through full search for calculating a quantization error value with the input vector for the search object codewords.

2. The method of claim 1, wherein the threshold is previously determined by a maximum value among MSE (Mean Squared Error) values for training vectors and a control element determined by experiment so as to minimize the number of the search object codewords.

3. The method of claim 2, wherein the control element is determined as a value between 0 and 1.

4. The method of claim 1, wherein the step of designating search object codewords comprises the steps of:

rearranging the codewords in the codebook in descending order by a size of element values corresponding to the particular position in the respective codewords constituting the codebook;

determining a point first corresponding to an element value smaller than the upper boundary value as a start point by comparing the upper boundary value with element values corresponding to the particular position in the rearranged codewords;

determining a point first corresponding to an element value larger than an element value that is smaller than the lower boundary value as an end point by comparing the lower boundary value with element values corresponding to the particular position in the rearranged codewords; and designating codewords existing between the start point and the end point as the search codewords.

5. The method of claim 1, wherein the step of designating search object codewords comprises the steps of:

rearranging the codewords in the codebook in ascending order by a size of element values corresponding to the particular position in the respective codewords constituting the codebook;

determining a point first corresponding to an element value larger than the lower boundary value as a start point by comparing the lower boundary value with element values corresponding to the particular position in the rearranged codewords;

determining a point first corresponding to an element value smaller than an element value that is larger than the lower boundary value by comparing the upper boundary value with element values corresponding to the particular position in the rearranged codewords; and designating codewords existing between the start point and the end point as the search codewords.

6. A computer-readable medium of instructions for searching a codebook having a plurality of codewords for an optimum codeword for quantizing an input vector, the instructions comprising:

a first set of instructions for calculating a lower boundary value and an upper boundary value by subtracting and adding a predetermined threshold from/to an element value corresponding to a particular position among a plurality of elements constituting the input vector;

a second set of instructions for designating, as search object codewords, codewords having element values existing between the lower boundary value and the upper boundary value among element values corresponding to the particular position in the respective codewords constituting the codebook; and a third set of instructions for determining optimum codewords having a minimum quantization error value through full search for calculating a quantization error value with the input vector for the search object codewords.

7. The computer-readable medium of instructions of claim 6, wherein the threshold is previously determined by a maximum value among MSE (Mean Squared Error) values for training vectors and a control element determined by experiment so as to minimize the number of the search object codewords.

8. The computer-readable medium of instructions of claim 7, wherein the control element is determined as a value between 0 and 1.

9. The computer-readable medium of instructions of claim 6, wherein the second set of instructions includes instructions for:

rearranging the codewords in the codebook in descending order by a size of element values corresponding to the particular position in the respective codewords constituting the codebook;

determining a point first corresponding to an element value smaller than the upper boundary value as a start point by comparing the upper boundary value with element values corresponding to the particular position in the rearranged codewords;

determining a point first corresponding to an element value larger than an element value that is smaller than the lower boundary value as an end point by comparing the lower boundary value with element values corresponding to the particular position in the rearranged codewords; and designating codewords existing between the start point and the end point as the search codewords.

10. The computer-readable medium of instructions of claim 6, wherein the second set of instructions includes instructions for:

rearranging the codewords in the codebook in ascending order by a size of element values corresponding to the particular position in the respective codewords constituting the codebook;

determining a point first corresponding to an element value larger than the lower boundary value as a start point by comparing the lower boundary value with element values corresponding to the particular position in the rearranged codewords;

determining a point first corresponding to an element value smaller than an element value that is larger than the lower boundary value by comparing the upper boundary value with element values corresponding to the particular position in the rearranged codewords; and designating codewords existing between the start point and the end point as the search codewords.

* * * * *